United States Patent [19]

Nagumo et al.

[11] 4,167,754

[45] Sep. 11, 1979

[54] SOLID STATE TELEVISION CAMERA WITH NOISE ELIMINATING CIRCUIT

[75] Inventors: Fumio Nagumo, Yokohama; Kaichi Yamamoto, Zama, both of Japan

[73] Assignee: Sony Corporation, Tokyo, Japan

[21] Appl. No.: 871,636

[22] Filed: Jan. 23, 1978

[30] Foreign Application Priority Data

Jan. 28, 1977 [JP] Japan .................................. 52/9108

[51] Int. Cl.$^2$ .............................................. H04N 5/21
[52] U.S. Cl. ................................... 358/167; 358/212; 358/213
[58] Field of Search ............... 358/167, 209, 212, 213

[56] References Cited

FOREIGN PATENT DOCUMENTS 28937 3/1975 Japan .
28938 3/1975 Japan .

OTHER PUBLICATIONS

"BBC Research Center of Britain Manufactured a Defect Eliminating Circuit for a CCD TV Camera by way of Trial" Nikkei Electronics, 8/23/1976 p. 87.

Primary Examiner—Richard Murray
Attorney, Agent, or Firm—Lewis H. Eslinger; Alvin Sinderbrand

[57] ABSTRACT

A solid state television camera with a noise eliminating circuit includes a solid state image sensor of semiconductor material to provide an output signal in correspondence to the image of an object projected thereon; a memory to memorize the positions of crystal defects in the semiconductor material; and a control circuit responsive to the output of the memory for eliminating from the output signal of the solid state image sensor noise due to crystal defects in the semiconductor material. The position of the first of the crystal defects encountered in the raster is determined by the distance, measured either along the successive scanning lines or along the orthogonal axes of the raster, between a reference point and such first crystal defect and that distance is encoded and memorized in the memory. The position of any other crystal defect is determined by the similarly measured distance between such other crystal defect and the crystal defect prior thereto, which distance is also encoded and memorized in the memory.

12 Claims, 13 Drawing Figures

FIG. 4
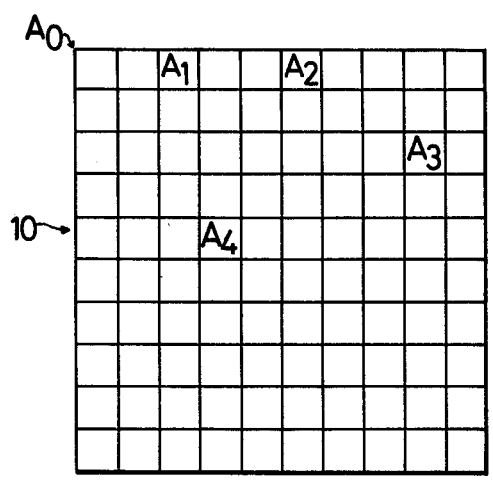
FIG. 5
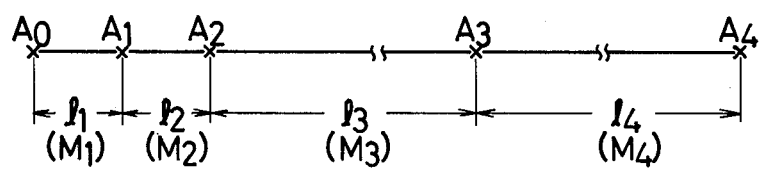
FIG. 6
| | |
|---|---|
| $l_4 = A_4 - A_3$ | $M_4$ |
| $l_3 = A_3 - A_2$ | $M_3$ |
| $l_2 = A_2 - A_1$ | $M_2$ |
| $l_1 = A_1$ | $M_1$ |
FIG. 7
($M_1$) | 0 | 0 | 0 | 0 | 1 | 1 |
($M_2$) | 0 | 0 | 0 | 0 | 1 | 1 |
($M_3$) | 0 | 0 | 1 | 0 | 1 | 1 |

FIG.9A 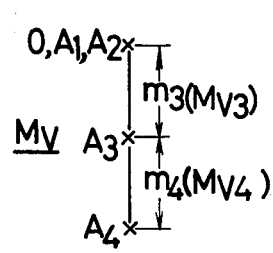 FIG.9B 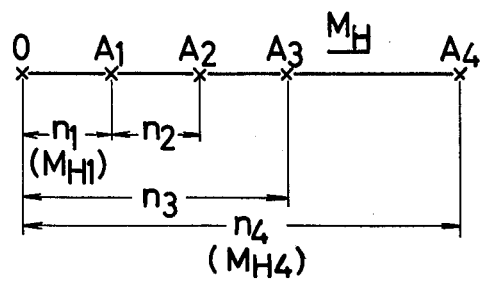
FIG.10
| $M_V$ | |
|---|---|
| $m_4 = A_4 - A_3$ | $M_{V4}$ |
| $m_3 = A_3 - A_2$ | $M_{V3}$ |
| $m_2 = A_2 - A_1 (=0)$ | $M_{V2}$ |
| $m_1 = A_1$ | $M_{V1}$ |
| $M_H$ | |
|---|---|
| $n_4 = A_4$ | $M_{H4}$ |
| $n_3 = A_3$ | $M_{H3}$ |
| $n_2 = A_2 - A_1$ | $M_{H2}$ |
| $n_1 = A_1$ | $M_{H1}$ |

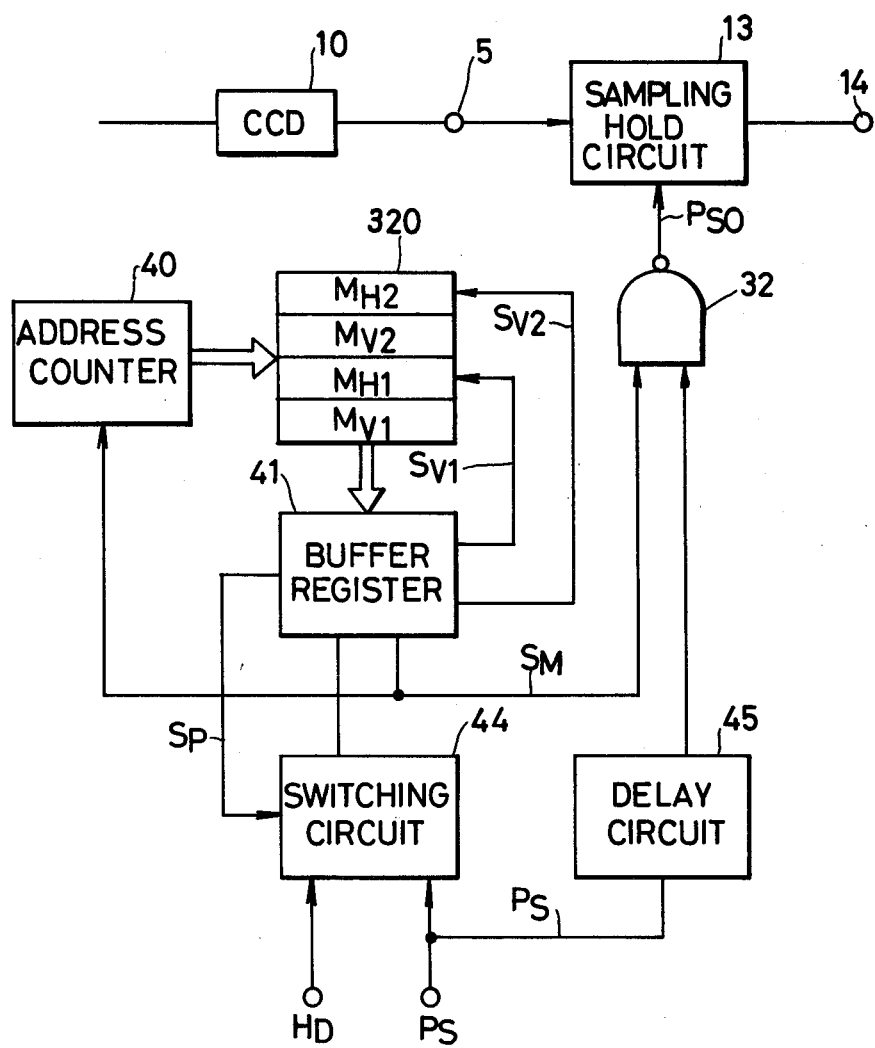

SOLID STATE TELEVISION CAMERA WITH NOISE ELIMINATING CIRCUIT

BACKGROUND OF THE INVENTION

1. Field of the Invention

The present invention relates to a solid state television camera which uses a semiconductor element, for example, a charge coupled device, as an image sensor, and more particularly is directed to a solid state television camera, as aforesaid, which has an improved circuit for eliminating noise caused by defects in the semiconductor material or crystal of the charge coupled device.

2. Description of the Prior Art

Solid state television cameras have been proposed in which charge coupled devices (hereinafter referred to as CCDs) are used as solid state image sensors. A CCD is constructed by forming a plurality of electrodes with a predetermined pitch therebetween on an insulating layer covering one surface of a semiconductor crystal substrate. The optical image of an object is projected on the image sensor from the side having the electrodes thereon or from the other side of the substrate. The projected optical image generates a corresponding pattern of charge carriers in the substrate under the electrodes. These charges are then read out successively from the CCD or transferred to a storage array of CCD elements by clock pulses applied to the electrodes.

Since it is rather difficult to make the semiconductor crystal of a CCD uniform over a substantial area, local crystal defects often are produced, and electric charges are apt to be thermally produced at such defects with a resultantly abnormally large dark current. As a result, when the camera using the above described CCD picks up an object whose image is projected on the CCD, noise appears in the resulting output signal at those portions where the dark current is abnormally large. Such noise having a higher level than the white level is mixed in the output signal of the camera and undesirably appears in the reproduced picture.

In the prior art, in order to remove such noise, it is proposed to use a memory circuit in which the positions of crystal defects in the semiconductor substrate are memorized. The output signal of the CCD is controlled with the output of the memory circuit to eliminate the noise, for example, by passing the output of the CCD through a sample-and-hold circuit which is made to sample the CCD output signal only so long as the memory output indicates that the respective picture element of the CCD is free of any crystal defect.

Normally, the existence or non-existence of a crystal defect is memorized for every picture element of the CCD. For a CCD having a matrix of picture elements with $N_H$ picture elements in the horizontal direction and $N_V$ picture elements in the vertical direction, the memory circuit requires a memory capacity of $N_H \cdot N_V$ bits. In the usual reproduced picture of a television receiver, $N_H$ is 300 to 500, and $N_V$ is 200 to 300. Accordingly, if the positions of the crystal defects are memorized in respect to all of the picture elements, a memory with a very high capacity, for example, from 60,000 to 150,000 bits, is required. Such a memory circuit is very expensive and, therefore, it is difficult to provide an inexpensive solid state television camera of the described kind.

In order to reduce the required memory capacity, the existence or non-existence of a crystal defect is not memorized for every picture element in order, but rather only the positions of those picture elements having the crystal defects may be encoded and memorized in the memory circuit. For example, the positions of the picture elements having crystal defects are encoded with respect to the X-axis and Y-axis of the orthogonal coordinates on the semiconductor substrate. When the number $N_H$ of the picture elements in the horizontal scanning direction is about 500, the position of any one of the picture elements in the horizontal scanning direction can be expressed with the capacity of 9 bits. Similarly, when the number $N_V$ of the picture elements in the vertical scanning direction is about 250, the position of any one of the picture elements in the vertical scanning direction can be expressed with the capacity of 8 bits. When an interlace scanning method is employed, one additional bit is required to identify whether the field is even or odd. Therefore, a total of 18 bits are required to express the position of each of the picture elements having a crystal defect with respect to the X-axis and Y-axis of the orthogonal coordinates and to provide identification of the field. If the maximum permissible number of picture elements with crystal defects is 20 for a usable CCD, the memory may have a capacity of only about 400 bits. A memory with the foregoing low capacity can be economically provided. However, as will be hereinafter indicated, the known noise eliminating circuit requires relatively complicated circuit elements, such as, address counters and a coincidence circuit, in association with the memory.

OBJECTS AND SUMMARY OF THE INVENTION

Accordingly, it is generally an object of the present invention to provide a solid state television camera with an improved noise eliminating circuit.

More specifically, an object of the invention is to provide a solid state television camera with a noise eliminating circuit and in which the noise which appears in an output signal of a solid state image sensor having a semiconductor substrate due to crystal defects in the latter can be removed effectively in a circuit of simple construction.

It is a further object of the invention to provide a solid state television camera with a noise eliminating circuit in which the circuits that are associated with a memory are simplified.

In accordance with an aspect of this invention, a solid state television camera with a noise eliminating circuit includes solid state image sensor means of a semiconductor material providing an output signal corresponding to an image of an object projected thereon; memory means to memorize the positions of crystal defects in the semiconductor material, the position of the first of the crystal defects being determined by the distance between a reference point and the first crystal defect, which distance is encoded and memorized in the memory means, and the position of at least one of the other crystal defects being determined by the intervening distance between such other crystal defect and the crystal defect prior thereto, with the intervening distance also being encoded and memorized in the memory means; and control means to control the output signal from the solid state image sensor means by the output of the memory means.

The above, and other objects, advantages and features of the invention, will be apparent in the ensuing

BRIEF DESCRIPTION OF THE DRAWINGS

FIG. 4 is a schematic view identifying picture elements of a CCD with crystal defects and to which reference will be made in explaining embodiments of this invention;

FIGS. 5 to 7 are diagrammatic views to which reference will be made in explaining a scheme with which the positions of crystal defects are memorized in a memory according to one embodiment of this invention;

FIGS. 9A, 9B and 10 are diagrammatic views to which reference will be made in explaining a scheme by which the positions of crystal defects are memorized in a memory according to a second embodiment of this invention;

FIG. 12 is a circuit diagram of a noise eliminating circuit according to a third embodiment of this invention.

DESCRIPTION OF THE PREFERRED EMBODIMENTS

In order to facilitate understanding of this invention, a noise eliminating circuit with a memory according to the prior art will first be described with reference to FIG. 1.

The so-called "interline transfer method" is employed for the CCD used in the circuit of FIG. 1 and in the later to be described embodiments of this invention. Since such CCD is well known, it will only be briefly described with reference to FIG. 2.

Figure 2:
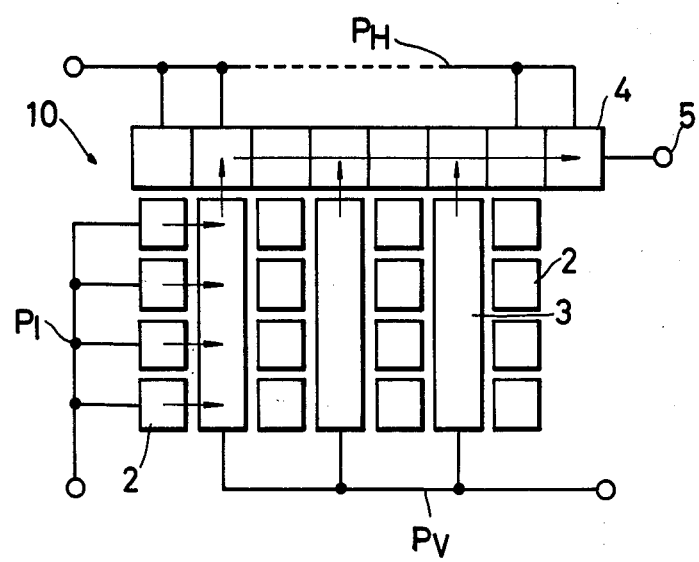
FIG. 2 is a schematic view of a CCD of the interline transfer type that may be used in the circuit of FIG. 1 and in noise eliminating circuits according to this invention.

In the CCD 10 of FIG. 2, picture elements 2 are arranged in a number of vertical rows. Vertical shift registers 3 for transferring the charge carriers from the rows of the picture elements 2 are arranged alongside the respective vertical rows of picture elements. The charge carriers are transferred from the vertical shift registers 3 to a horizontal shift register 4 in order. An information signal is read out from an output terminal 5 of the horizontal shift register 4. A pulse $P_I$ is applied to each of the picture elements 2 to store the carriers under the electrodes and to transfer the carriers. A pulse $P_V$ is applied to each of the vertical shift registers 3 as a transfer pulse. A pulse $P_H$ is applied to the horizontal shift register 4 as a read-out pulse.

Figure 1:
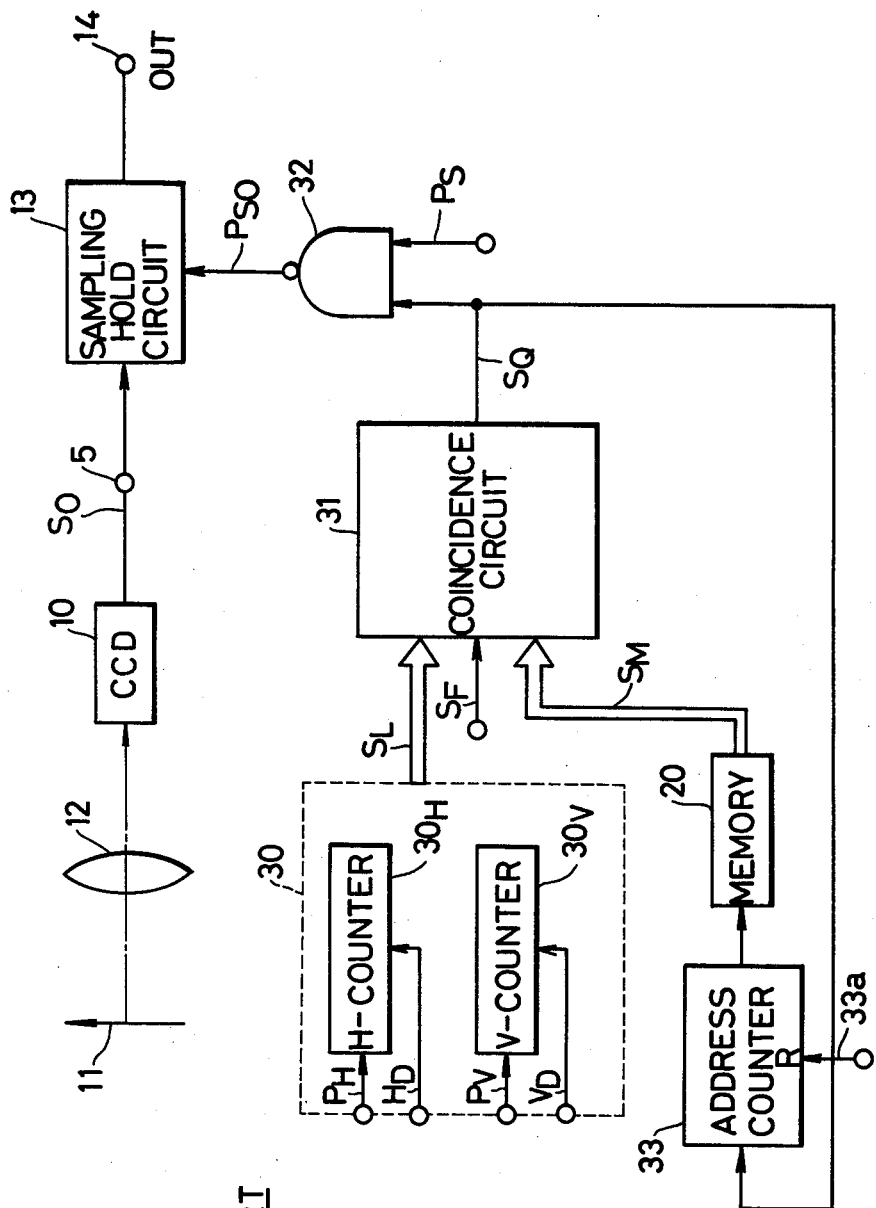
FIG. 1 is a circuit diagram of a prior art noise eliminating circuit for a solid state television camera.

As shown on FIG. 1, an image of an object 11 in the field of view of the camera is projected through an optical system 12 onto the CCD 10. The output signal $S_O$ is supplied from terminal 5 through a sampling and hold circuit 13 to an output terminal 14. The sampling condition of the sampling and hold circuit 13 is controlled by a gated sampling pulse $P_{SO}$ which is synchronized with the read-out pulse $P_H$ and controlled by the output of a memory 20.

The encoded positions of the crystal defects are memorized in memory 20 which is, for example, a ROM (Read Only Memory). An address counter 30 for the CCD 10 consists of an H-counter 30H for counting the encoded horizontal positions and a V-counter 30V for counting the encoded vertical positions. The read-out pulse $P_H$ is supplied to H-counter 30H, and a horizontal synchronizing signal $H_D$ is supplied as a reset signal to a reset terminal of H-counter 30H. The transfer pulse $P_V$ is supplied to V-counter 30V, and a vertical synchronizing signal $V_D$ is supplied as a reset signal to a reset terminal of V-counter 30V.

Figure 3:
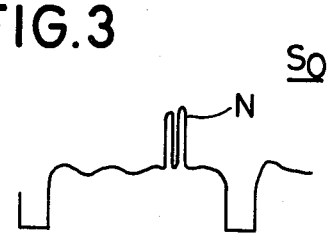
FIG. 3 is a wave form of an output signal that may be derived from the CCD of FIG. 2.

A position signal $S_L$ provided by address counter 30 and a field signal $S_F$ indicating whether the field is odd or even are supplied to a coincidence circuit 31. An output $S_M$ of memory 20 is also supplied to coincidence circuit 31. When the content of field signal $S_F$ and position signal $S_L$ coincides with the content of memory output $S_M$, that is, when memory output $S_M$ identifies a particular position of CCD 10 as having a crystal defect and the position signal $S_L$ from counter 30 identifies that particular position, then a coincidence signal $S_Q$ is provided at the output of circuit 31. The output of circuit 31 is applied to one input of a NAND gate circuit 32 which, at another input, receives a train of sampling pulses $P_S$ synchronized with the read-out pulses $P_H$. If the coincidence signal $S_Q$ is normally at a relatively low or "0" level and is raised to a relatively high or "1" level when the content of field signal $S_F$ and position signal $S_L$ coincides with the content of memort output $S_M$, then it will be seen that the sampling pulse $P_S$ is normally passed through gate 32 as gated sampling pulse $P_{SO}$ and that pulse $P_S$ is blocked at gate 32 whenever coincidence signal $S_Q$ is raised to the level "1". Accordingly, so long as coincidence signal $S_Q$ is "0", as is the case when the position signal $S_L$ identifies a position at which no crystal defect is memorized in memory 20, then the output $S_O$ from CCD 10 is correspondence to such position is sampled and held in circuit 13 to provide the output at terminal 14. However, when the coincidence signal $S_Q$ rises to "1", in which case, the output $S_O$ of CCD 10 is from a position at which a crystal defect has been memorized in memory 20, the blocking of pulse $P_S$ by NAND gate 32 stops the sampling operation of sampling and hold circuit 13. Accordingly, the signal of the previous picture element is held at the terminal 14. Thus, the noise N contained in the output signal $S_O$ of CCD 10 due to a crystal defect, as shown in FIG. 3, is eliminated by the selective sampling operation of the sampling and hold circuit 13. Further, the output containing such noise N is replaced by the output occurring during the scanning of the previous picture element of CCD 10.

The coincidence signal $S_Q$ is further shown to be supplied to another address counter 33 for memory 20 so that, upon each occurrence of the raised level "1" of the coincidence signal $S_Q$, address counter 33 causes the next memory output $S_M$ to issue from memory 20. Finally, in the prior art circuit of FIG. 1, a reset signal having a period equal to that of each frame as applied to a reset terminal 33a of address counter 33.

As above described, when only the positions of the picture elements having crystal defects are encoded to be memorized in memory 20, the memory capacity can be greatly reduced. Accordingly, the memory of a solid state television camera of such kind can be manufactured at a relatively low cost. However, since the prior art circuit shown on FIG. 1 requires the address counter 30 and the coincidence circuit 31 for detecting the coincidence of the memory output $S_M$ with the position signal $S_L$, peripheral circuits that have to be associated with the memory 20 are still quite complicated.

The simplification of such peripheral circuits in accordance with this invention will now be described with reference to FIGS. 4–8 in which parts corresponding to those previously described with reference to FIG. 1 are identified by the same reference numerals. Assuming that the semiconductor substrate of the CCD 10 has crystal defects at the positions indicated at $A_1$, $A_2$, $A_3$ and $A_4$ on FIG. 4, it will be noted that, in the embodiment of the invention presently being described, the positions of the crystal defects $A_1$–$A_4$ are expressed in one dimension, even though the crystal defects are actually located at various positions in the two-dimensional plane of the semiconductor substrate.

A reference point $A_0$ for the one dimension used in expressing the positions of the defects $A_1$–$A_4$ may be the starting point of the first horizontal scanning line in the field, with the first horizontal scanning line, the second horizontal scanning line, the third horizontal scanning line, - - - and so on, being considered successively one after the other. In such one dimensioned scheme, the positions of the crystal defects $A_1$–$A_4$ appear as shown in FIG. 5.

In encoding the positions of the crystal defects $A_2$, $A_3$ and $A_4$, the distance from the reference point $A_0$ to each defect is not counted, but rather the distance between successively adjacent crystal defects is counted, with each counting unit being one picture element. However, the position of the first crystal defect $A_1$ nearest to the reference point $A_0$ is represented by the distance $l_1$ between the reference point $A_0$ and the crystal defect $A_1$.

The distance $l_1$ is encoded, for example, as a binary number, and memorized as the position of the crystal defect $A_1$. The distance $l_2$ between the crystal defects $A_1$ and $A_2$ is encoded and memorized as the position of the crystal defect $A_2$, and, similarly, the distance $l_3$ between the crystal defects $A_2$ and $A_3$ is encoded and memorized as the position of the crystal defect $A_3$ and the distance $l_4$ between the crystal defects $A_3$ and $A_4$ is encoded and memorized as the position of the crystal defect $A_4$. In the illustrated example of a CCD having crystal defects at four positions or picture elements $A_1$ to $A_4$, four memory units $M_1$ to $M_4$ are required to constitute the memory 120. As shown on FIG. 6, the distance $l_1$ between reference point $A_0$ and crystal defect $A_1$ is memorized as a first memory content in first memory unit $M_1$, the distance $l_2$ between crystal defects $A_1$ and $A_2$ is memorized as a second memory content in second memory unit $M_2$, the distance $l_3$ between crystal defects $A_2$ and $A_3$ is memorized as a third memory content in third memory unit $M_3$, and the distance $l_4$ between the crystal defects $A_3$ and $A_4$ is memorized as a fourth memory content in fourth memory unit $M_4$.

The number of bits required in each memory unit for memorizing the position of each respective crystal defect is determined in the following manner. If M bits are required to encode the number $N_H$ of the picture elements in the horizontal direction, and N bits are required to encode the number $N_V$ of the picture elements in the vertical direction, the capacity of $(N+M)$ bits is required in each of the memory units $M_1$ to $M_4$. For example, a memory unit having the capacity of 17 bits can be used for each crystal defect in a CCD in which $N_H$ is equal to about 500 and $N_V$ is equal to about 250.

When the number of the crystal defects is 20, the total capacity of the memory 20 used in the noise eliminating circuit according to this invention may be about 400 bits.

FIG. 7 shows the coded memory contents of the memory units $M_1$, $M_2$ and $M_3$ for representing the positions of the crystal defects $A_1$, $A_2$ and $A_3$, respectively, in accordance with this invention. Since the distance between the reference point $A_0$ and the crystal defect $A_1$ on FIG. 4 amounts to "3" when the counting unit is one picture element, a binary coded signal "0000011" is memorized in the first memory unit $M_1$. Similarly, since the distance between the crystal defects $A_1$ and $A_2$ amounts to "3", a binary coded signal "0000011" is memorized in the second memory unit $M_2$, and, since the distance between the crystal defects $A_2$ and $A_3$ amounts to "23" on FIG. 4, a binary coded signal "0010111" is memorized in the third memory unit $M_3$. Although not shown on FIG. 7, a binary coded signal for the distance "15" between the crystal defects $A_3$ and $A_4$ on FIG. 4 is memorized in the fourth memory unit $M_4$.

Figure 8:
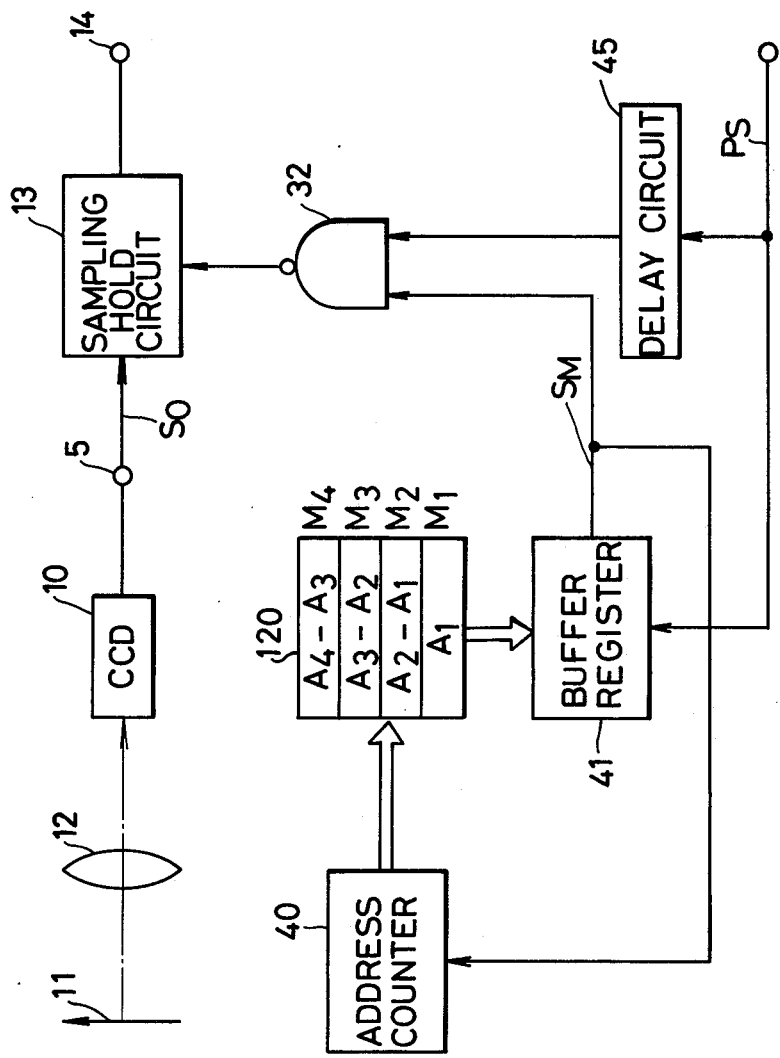
FIG. 8 is a circuit diagram of a noise eliminating circuit according to one embodiment of this invention.

FIG. 8 shows a noise eliminating circuit according to this invention including the memory 120 comprised of the units $M_1$ to $M_4$ in which the distances $l_1$ to $l_4$, respectively, are encoded and memorized. The contents of the memory units $M_1$ to $M_4$ are successively transferred to a buffer register 41 in accordance with outputs of an address counter 40 having its output connected to the memory 120. The buffer register 41 includes a down counter for counting down the memory content transferred thereto from one of the memory units and a zero detector for detecting when the output of the down counter is reduced to zero. The sampling pulse $P_S$ is supplied, as a clock pulse, to the buffer register 41 to count down the transferred memory content in the latter. When the transferred memory content in the buffer register 41 has been reduced to zero, a defect position signal or control signal $S_M$ is obtained as the output from the buffer register 41 and is supplied to the NAND gate circuit 32.

The buffer register 41 may be of the type which provides a so-called borrow signal when the content "0" of the down counter is further counted down by the next sampling pulse $P_S$. In that case, the borrow signal is employed as the control signal $S_M$ supplied to the NAND gate circuit 32. Since the sampling operation of sampling and hold circuit 13 is effected with the output of NAND gate circuit 32 to which the control signal $S_M$ is applied at each time corresponding to a position of a crystal defect, the noise due to each crystal defect is surely eliminated from the output signal at terminal 14 in the same manner as has been described with reference to FIG. 1.

The control signal $S_M$ is also shown to be applied to the address counter 40, so that, upon the occurrence of each control signal $S_M$, the next memory content in memory 120 is transferred to buffer register 41. Thus, after the noise due to the crystal defect at position $A_1$ has been eliminated from the output signal at terminal 14, the memory content of memory unit $M_2$ is transferred to the buffer register 41, and is counted down with the sampling pulse $P_S$. When it has been reduced to zero, the control signal $S_M$ is again obtained from the buffer register 41 at the time when the signal of the picture element containing the crystal defect $A_2$ is obtained at terminal 5. The sampling operation by sampling and hold circuit 13 is prevented by the control signal $S_M$ to eliminate the noise due to the crystal defect $A_2$. Similarly, the memory contents of the memory units $M_3$ and $M_4$ are transferred to the buffer register 41 in order, and the noises due to the crystal defects $A_3$ and $A_4$ are eliminated from the output signal obtained at terminal 14.

In the circuit of FIG. 8, sampling pulse $P_S$ is shown to be supplied through a delay circuit 45 to the gate circuit 32 so that the sampling pulse $P_S$ will be in a predetermined phase relationship to the control signal $S_M$.

Another embodiment of this invention using the CCD 10 of FIG. 4 will now be described with reference to FIGS. 9-11. In this embodiment, another scheme is employed for representation of the distances between the successive crystal defects, more particularly, the positions of, and distances between the crystal defects are represented on the orthogonal coordinates. FIG. 9A shows the positions of the crystal defects $A_1$ to $A_4$ with respect to the Y-axis of the orthogonal coordinates. As shown in FIG. 10, a memory element $M_V$ for the vertical positions of the crystal defects $A_1$ to $A_4$ consists of a corresponding number of memory units, that is, four memory units $M_{V1}$ to $M_{V4}$ corresponding to the crystal defects $A_1$ to $A_4$, respectively. An encoded vertical position $m_1$ of the crystal defect $A_1$ is memorized in the first memory unit $M_{V1}$. An encoded distance $m_2$ between the crystal defects $A_1$ and $A_2$ is memorized in the second memory unit $M_{V2}$, and such distance $m_2$ is zero, because the crystal defects $A_1$ and $A_2$ lie on the same horizontal scanning line in th CCD 10 of FIG. 4. An encoded distance $m_3$ between the crystal defects $A_2$ and $A_3$ is memorized in the third memory unit $M_{V3}$, and an encoded distance $m_4$ between the crystal defects $A_3$ and $A_4$ is memorized in the fourth memory unit $M_{V4}$.

FIG. 9B represents the positions of the crystal defects $A_1$ to $A_4$ with respect to the X-axis of the orthogonal coordinates. As shown in FIG. 10, a memory element $M_H$ for the horizontal positions of the crystal defects $A_1$ and $A_4$ consists of four memory units $M_{H1}$ to $M_{H4}$ corresponding to the crystal defects $A_1$ to $A_4$, respectively. An encoded horizontal position $n_1$ of the crystal defect $A_1$ is memorized in the first memory unit $M_{H1}$, and is represented by the distance between the start point ($A_0$) of the first horizontal scanning line, on which the crystal defect $A_1$ lies, and the crystal defect $A_1$. An encoded distance $n_2$ between the crystal defects $A_1$ and $A_2$ is memorized as the horizontal position of the crystal defect $A_2$ in the second memory unit $M_{H2}$. The encoded horizontal distance $n_3$ between the start point of the third horizontal scanning line, on which the crystal defect $A_3$ lies, and the crystal defect $A_3$ represents the horizontal position of the crystal defect $A_3$, and the encoded horizontal distance $n_3$ is memorized in the third memory unit $M_{H3}$. The encoded horizontal distance $n_4$ between the start point of the fifth horizontal scanning line, on which the crystal defect $A_4$ lies, and the crystal defect $A_4$ represents the horizontal position of the crystal defect $A_4$, and the encoded horizontal distance $n_4$ is memorized in the fourth memory unit $M_{H4}$. In FIG. 9B, the horizontal positions of the crystal defects $A_1$ to $A_4$ are shown on a line in the scanning order for convenience of illustration. However, it will be clear from the above description condidered with FIG. 4, that the distance $n_4$ is actually shorter than the distance $n_3$.

Figure 11:
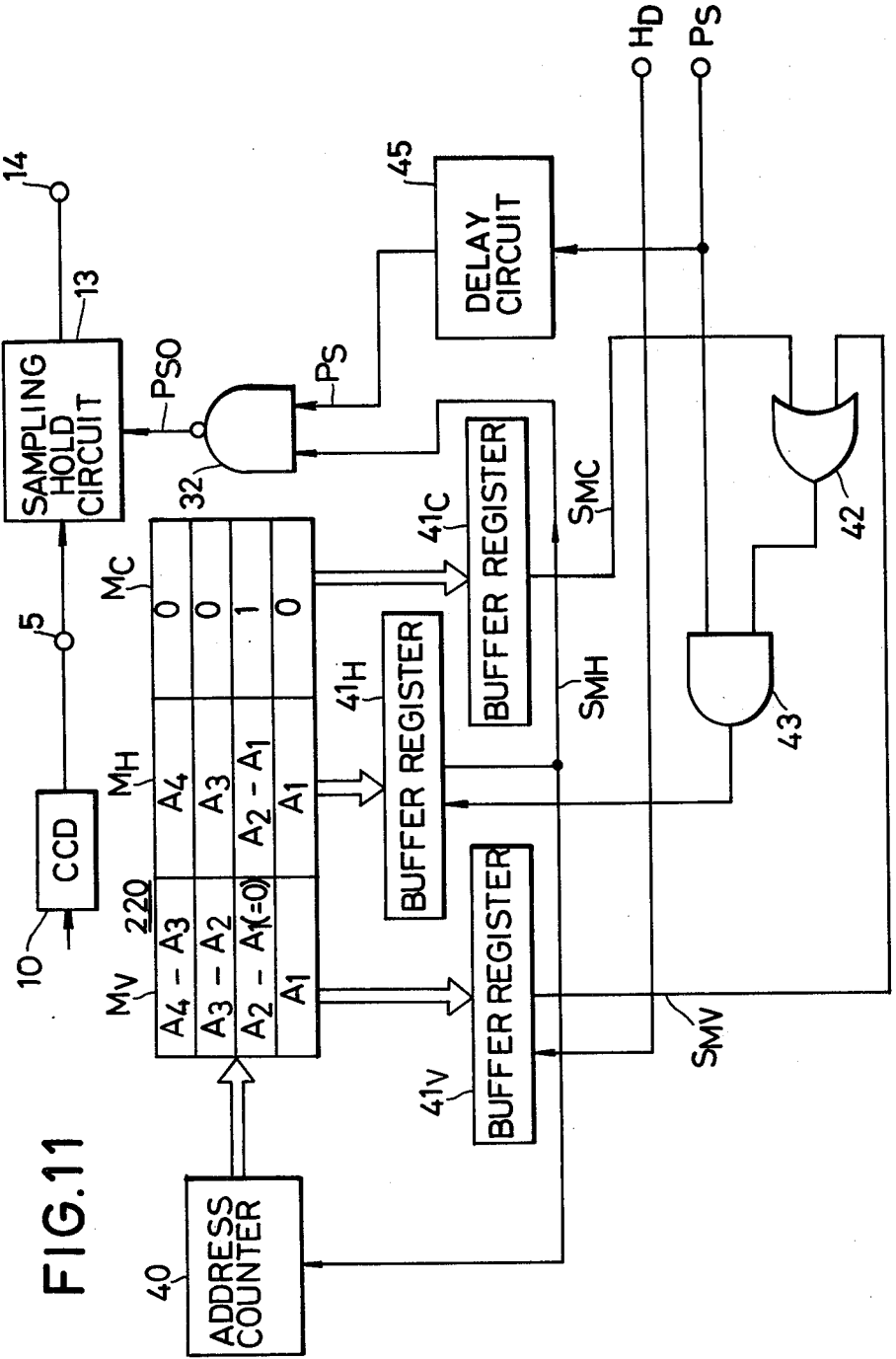
FIG. 11 is a circuit diagram of a noise eliminating circuit according to the second embodiment of this invention.

FIG. 11 shows a noise eliminating circuit according to this invention which includes the above described memory elements $M_V$ and $M_H$ constituting a memory 220.

The memory elements $M_V$ and $M_H$ of memory 220 are simultaneously driven or addressed with the output of the address counter 40. However, a buffer register 41H for the memory element $M_H$ is driven so as to count down a horizontal position or content from memory element $M_H$ only when a control signal is obtained from a buffer register 41V for the memory element $M_V$, that is, only after a vertical position or content from one of the memory units of element $M_V$ has been counted down to zero in buffer register 41V.

The detail arrangement and operation of the noise eliminating circuit of FIG. 11 will now be described.

As a first step, address counter 40 causes the memory content $m_1$ of memory unit $M_{V1}$ of the memory element $M_V$ to be transferred to buffer register 41V. Then, the counter in buffer register 41V is counted down from $m_1$ with the clock pulse $H_D$. When the memory content $m_1$ of unit $M_{V1}$ has been reduced to zero in register 41V, a control signal $S_{MV}$ is generated by the zero-detector in buffer register 41V. Thus, the vertical position $m_1$ of the crystal defect $A_1$ has been counted, and the resulting control signal $S_{MV}$ is applied through an OR gate 42 to one input of an AND gate 43. The clock pulse $P_S$ is applied to another input of AND gate 43, so as to pass through the latter so long as control signal $S_{MV}$ is generated by buffer register 41V.

The counter in the buffer register 41H, which has previously received the content $n_1$ of memory unit $M_{H1}$, is counted down with the clock pulse $P_S$ when the latter passes through AND gate 43. When the memory content $n_1$ in register 41H has been reduced to zero, a control signal $S_{MH}$ is generated by the zero-detector in buffer register 41H. Thus, the horizontal position $n_1$ has been counted. Such control signal $S_{MH}$ is applied to the NAND gate circuit 32 similarly to the control signal $S_M$ in FIG. 8.

The control signal $S_{MH}$ is applied also to the address counter 40 which is counted up thereby so that the next memory contents $m_2$ and $n_2$ of the memory units $M_{V2}$ and $M_{H2}$ in memory elements $M_V$ and $M_H$, respectively, are transferred to buffer registers 41V and 41H. Then, the above described operation is repeated to count the vertical and horizontal positions $m_2$ and $n_2$ of the crystal defect $A_2$.

When two or more crystal defects lie on the same horizontal scanning line, for example, as in the case of the defects $A_1$ and $A_2$ on FIG. 4, the memory content for the vertical position of each of those crystal defects is zero with the exception of the first crystal defect nearest to the start point of the respective horizontal scanning line. For example, when the memory content for the vertical position of the crystal defect $A_1$ is transferred from memory unit $M_{V1}$ to buffer register 41V, the control signal $S_{MV}$ can be obtained from the buffer register 41V upon the latter being counted down to zero by the clock pulse $H_D$, and, thereafter, the buffer register 41H can be driven or counted down by clock pulse $P_S$ due to the application of control signal $S_{MV}$ to AND gate 43. However, when the memory content for the vertical position of the crystal defect $A_2$, which follows in sequence the crystal defect $A_1$, is transferred to the buffer register 41V, the control signal $S_{MV}$ cannot be obtained from buffer register 41V, since the memory content for the vertical position of the crystal defect $A_2$ is "0". In the absence of a control signal $S_{MV}$, the buffer register 41H cannot be driven. For controlling the buffer register 41H in such a case, a control memory element $M_C$ is further provided in the memory 220. As shown in FIG. 11, a memory content "1" is memorized in each memory unit of the control memory element $M_C$ which corresponds to a memory unit, for example, the unit $M_{V2}$ of memory element $M_V$, in which there is memorized the vertical position of a crystal defect lying on the same horizontal line as a preceding crystal defect. The memory element $M_C$ is also driven or addressed by address counter 40 so as to transfer its memory contents successively to a buffer register 41C. A control signal $S_{MC}$ is obtained from the buffer register 41C and applied to another input of OR gate 42, when the memory content "1" is transferred to the buffer register 41C from memory element $M_C$. Accordingly, control signal $S_{MC}$ passes through OR gate 42 to AND gate 43 and the buffer register 41H for the horizontal position of the crystal defect $A_2$ is driven by the clock pulse $P_S$ passing through the AND gate 43.

In the above described embodiment of FIG. 11, the memory elements $M_V$ and $M_H$ are arranged in parallel with each other, and the memory contents are transferred simultaneously from corresponding units of elements $M_V$ and $M_H$ to the respective buffer registers 41V and 41H. However, in another embodiment of the invention shown on FIG. 12, the memory units $M_{V1}$ to $M_{V4}$ and $M_{H1}$ to $M_{H4}$ for the vertical and horizontal positions, respectively, of the crystal defects are alternately arranged in series with each other in a memory 320. Therefore, the memory contents for the vertical and horizontal positions of the successive crystal defects are alternately read out from the memory 320.

For simplification of the drawings, only the memory units $M_{V1}$, $M_{H1}$, $M_{V2}$ and $M_{H2}$ are shown on FIG. 12, that is, the memory units $M_{V3}$, $M_{H3}$, $M_{V4}$ and $M_{H4}$ are omitted from the drawings. Further, it is to be noted that the memory contents in the memory units $M_{V1}$ to $M_{V4}$ and $M_{H1}$ to $M_{H4}$ are the same as the memory contents in the memory units $M_{V1}$ to $M_{V4}$ and $M_{H1}$ to $M_{H4}$, respectively, on FIG. 11.

In operation of the circuit shown on FIG. 12, the memory content of the memory unit $M_{V1}$ is first transferred to the associated buffer register 41 in response to the output of the address counter 40. A switching circuit 44 is provided to alternatively apply the clock pulse $H_D$ or the clock pulse $P_S$ to the buffer register 41 for counting down a memory content transferred to the latter from memory 320. Initially, the clock pulse $H_D$ is supplied to buffer register 41 through switching circuit 44 which has been changed over to that condition by an output signal $S_P$ from buffer register 41. When the memory content of the memory unit $M_{V1}$ initially transferred to buffer register 41 has been reduced to zero with the clock pulse $H_D$, a drive signal $S_{V1}$ is generated by buffer register 41, and the output signal $S_P$ is again obtained from the latter. The memory content $M_{H1}$ is transferred from memory 320 to buffer register 41 by the application of drive signal $S_{V1}$ to memory 320. Since switching circuit 44 is changed over by signal $S_P$ so as to now pass the clock pulse $P_S$ to buffer register 41, the memory content of the memory unit $M_{H1}$ is counted down in register 41 by the clock pulse $P_S$. When the memory content of the memory unit $M_{H1}$ in buffer register 41 has been reduced to zero, a control signal $S_M$ is generated from the buffer register 41 and supplied to the NAND gate 32 and to the address counter 40. Thus, the horizontal (X-axis) and vertical (Y-axis) positions of the crystal defect $A_1$ are counted, and the noise due to the crystal defect $A_1$ is eliminated from the output signal CCD 10 in a manner similar to that described with reference to FIG. 1. The down counting to zero of the memory content of memory unit $M_{H1}$ in buffer register 41 again causes the latter to emit the output signal $S_P$ by which switching circuit 44 is changed back to the condition for applying clock pulse $H_D$ to buffer register 41. The application of control signal $S_M$ to address counter 40 causes the latter to effect the transfer to buffer register 41 of the content of memory unit $M_{V2}$ for counting down by clock pulse $H_D$, whereupon, the operation proceeds as described above with reference to the contents of memory units $M_{V1}$ and $M_{H1}$. Accordingly, the noises due to crystal defects $A_2$ to $A_4$ are also eliminated from the output at terminal 14. It will be noted that, in the embodiment of FIG. 12, only a single buffer register 41 is required, as contrasted with the plurality of buffer registers employed in the embodiment of FIG. 11.

It will be apparent from the above that, in accordance with this invention, the noise due to crystal defects in the semiconductor material constituting a part of the image sensor can be surely eliminated from the output signal of the image sensor, with each part of the output signal containing noise being replaced by a preceding part of the output signal free of noise. Since a special scheme or method is employed for memorizing the positions of the crystal defects in the memory 120, 220 or 320, the peripheral circuits associated with the memory are greatly simplified, in contrast to the conventional noise eliminating circuit of FIG. 1 which requires the counter 30 and coincidence circuit 31.

The above described embodiments of the invention specifically relate to the elimination of crystal defect induced noise from the output of a black-and-white television camera. However, this invention may also be applied to the elimination of such noise from the output of a color television camera.

Although a CCD image sensor of the interline transfer type has been used in the above described embodiments, it will be apparent that a CCD image sensor of the frame transfer type may be used in place thereof in a television camera according to this invention.

Further, although the CCD is described as being a CTD (charge transfer device) in the above embodiments, a BBD (bucket brigade device), CID (charge injection device) or MOS-type solid state device may be used in place of the CTD in a television camera according to this invention.

Moreover, the described ROM (read only memory) may be replaced by a RAM (random access memory) in noise eliminating circuits according to this invention.

Although specific embodiments of the invention have been described in detail herein with reference to the accompanying drawings, it is to be understood that the invention is not limited to those precise embodiments, and that various changes and modifications, some of which are indicated above, may be effected in the described embodiments by a person skilled in the art without departing from the scope or spirit of the invention as defined in the appended claims.

What is claimed is:

1. A solid state television camera with a noise eliminating circuit comprising:
   solid state image sensor means of semiconductor material for providing an output signal in correspondence to an image of an object projected thereon, said image sensor means including picture elements arranged in a raster having parallel scanning lines which are, in turn, arranged in order in a direction orthogonal to the direction of said scanning lines, and said semiconductor material having crystal defects at the locations of a plurality of said picture elements to create noises at corresponding times in said output signal;

memory means for memorizing the positions of said crystal defects in the semiconductor material, the position of the first of said crystal defects, considered in the direction along said raster, being memorized in said memory means as an encoded content representing the distance between a reference point on said raster and said first crystal defect, and the position of another of said crystal defects being memorized in said memory means as an encoded content representing the distance between a crystal defect previous to said other crystal defect and the latter;

address means for causing the encoded contents of said memory means to appear sequentially as the output from the latter in order of the positions of the respective crystal defects in said raster; and control means responsive to said output of the memory means for eliminating said noises from said output signal of the image sensor means.

2. A solid state television camera with a noise eliminating circuit according to claim 1; in which said distances between said reference point and said first crystal defect, and between said previous crystal defect and said other crystal defect, respectively, are measured along said scanning lines consecutively in said order.

3. A solid state television camera with a noise eliminating circuit according to claim 2; in which said memory means comprises memory units corresponding in number to the number of said crystal defects, and each having memorized therein the encoded content representative of the position of a respective one of said crystal defects.

4. A solid state television camera with a noise eliminating circuit according to claim 3; in which said control means includes sampling and hold means receiving said output signal from said image sensor means, gate means for applying a sampling signal to said sampling and hold means so as to cause repeated sampling of said output signal, and a buffer register receiving the output of said memory means for counting said encoded contents and providing a gate control signal by which said sampling signal is blocked at said gate means upon the occurrence in said output signal from the image sensor means of said noises due to the respective crystal defects.

5. A solid state television camera with a noise eliminating circuit according to claim 2; in which said distances from said reference point to said first crystal defect, and from said previous crystal defect to said other crystal defect, respectively, are measured in respect to said picture elements of the solid state image sensor means encompassed by said distances.

6. A solid state television camera with a noise eliminating circuit according to claim 1; in which said solid state image sensor means is a charge transfer device.

7. A solid state television camera with a noise eliminating circuit according to claim 6; in which said charge transfer device is a charge coupled device.

8. A solid state television camera with a noise eliminating circuit according to claim 1; in which each said distance is determined by first and second components thereof respectively extending in a first direction parallel to said scanning lines and in a second direction orthogonal to said scanning lines; and in which said other crystal defect and said crystal defect previous thereto are located on the same one of said scanning lines.

9. A solid state television camera with a noise eliminating circuit according to claim 8; in which said semiconductor material has a further crystal defect which is on one of said scanning lines different from the scanning line of the crystal defect previous to said further crystal defect, said first component of the distance to said further crystal defect is measured along said one scanning line from the starting point of the latter, and said second component of the distance to said further crystal defect is measured, in said second direction, from said scanning line of the crystal defect previous to said further crystal defect to said one scanning line.

10. A solid state television camera with a noise eliminating circuit according to claim 9; in which said memory means comprises first and second memory units for said first and second components, respectively, and corresponding in number to the number of said crystal defects.

11. A solid state television camera with a noise eliminating circuit according to claim 10; in which said first and second memory units for the first and second components are arranged in parallel with each other; and in which said control means includes sampling and hold means for periodically sampling said output signal from the image sensor means in response to a sampling pulse, gate means for applying said sampling pulse to said sampling and hold means, and first and second buffer registers to which contents of said memory units for said first and second components are respectively transferred by said address means, said first buffer register activating said second buffer register in response to counting by said first buffer register of the content from one of said first memory units, whereupon, said second buffer register counts the content from the respective second memory unit and provides a gate control signal by which said sampling pulse is blocked at said gate means upon the occurrence, in said output signal from the image sensor means, of said noises due to the respective crystal defects.

12. A solid state television camera with a noise eliminating circuit according to claim 10; in which said first and second memory units for the first and second components are alternately arranged in series with each other; and in which said control means includes sampling and hold means for periodically sampling said output signal from the image sensor means in response to a sampling pulse, gate means for applying the sampling pulse to said sampling and hold means, and a buffer register receiving and counting the content of one of said first memory units in response to said address means and then causing the transfer of the content of the corresponding one of said second memory units to said buffer register to be counted in the latter which then provides a gate control signal for blocking said sampling pulse at said gate means upon the occurrence, in said output signal from the image sensor means, of said noises due to the crystal defects.

* * * * *